United States Patent [19]
Kim et al.

[11] Patent Number: 6,040,597
[45] Date of Patent: Mar. 21, 2000

[54] ISOLATION BOUNDARIES IN FLASH MEMORY CORES

[75] Inventors: Unsoon Kim, Santa Clara; Yowjuang W. Liu, San Jose; Yu Sun, Saratoga, all of Calif.

[73] Assignee: Advanced Micro Devices, Inc., Sunnyvale, Calif.

[21] Appl. No.: 09/023,166

[22] Filed: Feb. 13, 1998

[51] Int. Cl.[7] .................................................. H01L 29/788
[52] U.S. Cl. ........................ 257/321; 257/622; 257/627; 257/374; 257/396; 257/397; 257/510; 257/513; 257/521; 257/527
[58] Field of Search .................................... 257/321, 627, 257/622, 374, 396, 397, 510, 513, 521, 527, 310

[56] References Cited

U.S. PATENT DOCUMENTS

| 3,765,969 | 10/1973 | Kragness et al. | 156/17 |
| 4,172,005 | 10/1979 | Muraoka et al. | 156/647 |
| 4,507,849 | 4/1985 | Shinozaki | 29/576 |
| 4,581,814 | 4/1986 | Celler et al. | 29/576 |
| 4,624,047 | 11/1986 | Tani | 29/576 |
| 5,010,556 | 4/1991 | Imanaka et al. | 372/46 |
| 5,328,559 | 7/1994 | Jerman | 156/647 |
| 5,683,075 | 11/1997 | Gaul et al. | 257/510 |
| 5,721,700 | 2/1998 | Katoh | 365/145 |
| 5,786,262 | 7/1998 | Jang et al. | 438/424 |

Primary Examiner—Sheila V. Clark
Assistant Examiner—H. D. Tran
Attorney, Agent, or Firm—LaRiviere, Grubman & Payne, LLP

[57] ABSTRACT

A wet etching process for establishing isolation grooves in a flash memory core wafer includes depositing nitride and/or oxide layers on a silicon substrate of the wafer, depositing a photoresist layer thereon, and then exposing predetermined portions of the photoresist layer to ultraviolet light to establish a desired groove pattern in the photoresist layer. A dry etching process is then used to remove the nitride and/or oxide layers beneath the groove pattern of the photoresist layer to thereby expose portions of the substrate. Next, the wafer is disposed in a wet etching solution such as potassium hydroxide to form grooves in the exposed portions of the silicon substrate. The wafer is oriented and disposed in the bath as appropriate for forming V-shaped grooves, such that after etching, the angled walls of the grooves can be easily exposed to a dopant beam directly above the wafer, without having to tilt the wafer or beam source. Thereby, the walls of the grooves are easily implanted with dopant.

11 Claims, 5 Drawing Sheets

ISOLATION BOUNDARIES IN FLASH MEMORY CORES

TECHNICAL FIELD

The present invention relates generally to computer flash memory systems, and more particularly to systems and methods for isolating flash memory elements.

BACKGROUND OF THE INVENTION

In computer flash memory such as might be used in, e.g., digital cameras, cellular telephones, and portable computing devices, a flash memory core containing a matrix of memory cells is surrounded by a periphery containing peripheral circuits. The cells in the core assume physical states which represent bits of data. Consequently, by configuring the core cells appropriately, data may be stored in the core and subsequently read by detecting the physical state of one or more core cells.

To enable the individual cells to maintain the physical state with which it has been programmed, each cell must be isolated from its neighboring cells. In the case of the peripheral area, isolation is achieved by a method referred to in the art as local oxidation of silicon, or "LOCOS". LOCOS isolation requires disposing a silicon oxide insulator region between active regions. While acceptable for isolating the peripheral area, however, LOCOS isolation is less than desirable for core array isolation. This is because it is desirable to minimize the core cell area to increase memory density, and the LOCOS isolation tends to encroach on the core memory cells, thereby decreasing core active area (and, hence, memory) density.

Accordingly, a dry plasma etch process using groove insulators such as CVD oxides or TEOS has been developed for isolating flash memory core memory cells from each other. In this process, a trench that has a flat bottom and nearly vertical side walls (and, hence, that is shaped somewhat like a flat "U") is formed in the silicon between core memory elements by directing a plasma beam into the silicon. The trench is filled with CVD oxides during etching. As recognized by the present invention, however, it is possible to establish isolation trenches using relatively simple wet etching processes.

Furthermore, during dry etching conductive dopant must be implanted into the wall of the trench by bombarding the trench with a dopant beam. This is to facilitate electrical connections to source regions of transistors subsequent to trench formation. While effective for facilitating transistor source electrical connections, to dope the almost vertical wall of the U-shaped trench the dopant beam source must be angled with respect to the vertical axis of the trench. This in turn requires that the beam source be moved about the periphery of the trench to obtain complete coverage of the wall during doping, or alternatively that the flash memory core be moved relative to the dopant source to achieve the same relative motion effect. As recognized herein, such a doping procedure complicates the fabrication process. As further recognized herein, wet etching can be used to form a trench that is relatively easy to dope.

Accordingly, it is an object of the present invention to provide a method and system for isolating core memory elements of a computer flash memory device. Another object of the present invention is to provide a method and system for isolating core memory elements of a computer flash memory device which does not require the use of dry etching. Still another object of the present invention is to provide a method and system for isolating core memory elements of a computer flash memory device by establishing isolation grooves between the trenches such that the walls of the isolation grooves can be easily and conveniently doped. Yet another object of the present invention is to provide a method and system for isolating core memory elements of a computer flash memory device that is easy to use and cost effective. Another object of the present invention is to provide a method and system for isolating core memory elements of a computer flash memory device that facilitates electrical connection to sources of transistors after trench formation.

BRIEF SUMMARY OF THE INVENTION

A process is disclosed for making a flash memory core. The process includes providing a silicon substrate which establishes a flash memory substrate, and at least one oxide layer is disposed on the substrate. Also, a photoresist layer is disposed on the oxide layer. The method includes exposing the photoresist layer to ultraviolet light to remove predetermined portions of the photoresist layer, and then removing portions of the oxide layer below the predetermined portions. The method then contemplates disposing the substrate in a wet etch solution to establish isolation grooves in the substrate.

In a preferred embodiment, the step of removing the oxide layer is accomplished by dry etching, and the substrate subsequently is disposed in the wet etch solution such that each groove defines an axis and a wall. In accordance with the present invention, at least a portion of the wall defines an angle of between twenty degrees and seventy degrees (20°–70°) with respect to the axis. More preferably, the angle is between forty degrees and sixty degrees (40°–60°) with respect to the axis, and the grooves are V-shaped. Preferably, an insulator is disposed in the grooves.

Per the present invention, the oxide layer can be a pad oxide layer, and the method further includes disposing a nitride layer on the pad oxide layer such that the flash memory core is a non-self aligned memory core. Alternatively, the oxide layer is a tunnel oxide layer, and the method further includes disposing a polysilicon layer on the tunnel oxide layer, a high temperature oxide layer on the polysilicon layer, and a nitride layer on the high temperature oxide layer. In this embodiment, the flash memory core is a self aligned memory core. A flash memory wafer made according to the present method, and a computing device incorporating the flash memory wafer, are also disclosed.

In another aspect of the present invention, a flash memory wafer includes a core memory region defining memory elements and isolation grooves separating the memory elements from each other. At least some of the grooves define respective axes and respective walls, and at least a respective portion of each wall defines an angle of between twenty degrees and seventy degrees (20°–70°) relative to the respective axis to facilitate directing a dopant beam against the walls.

In still another aspect, a method for making a flash memory wafer includes the step of wet etching a flash memory silicon substrate to establish a predetermined groove matrix therein.

Other features of the present invention are disclosed or apparent in the section entitled: "DETAILED DESCRIPTION OF THE INVENTION."

BRIEF DESCRIPTION OF DRAWINGS

For fuller understanding of the present invention, reference is made to the accompanying drawing in the following detailed description of the Best Mode of Carrying Out the Present Invention. In the drawings.

Figure 1:
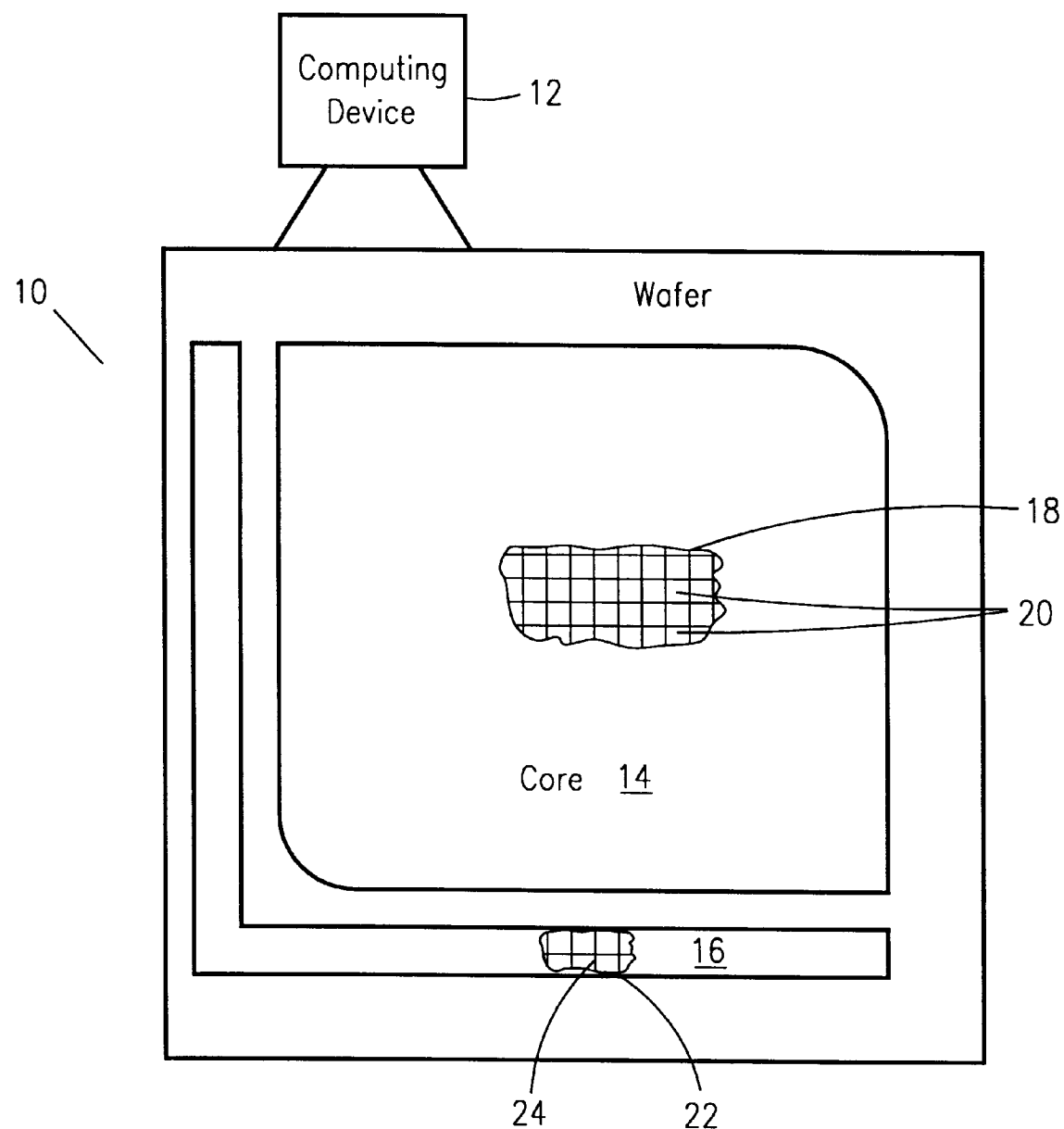
FIG. 1 is a schematic plan view of the present flash memory wafer in an exploded relationship with a computing device, with portions schematically cut away to show the memory elements.

Reference numbers refer to the same or equivalent parts of the present invention throughout the several figures of the drawing. In the description, the terms "vertical" and "horizontal" refer to the orientations of the figures shown, for purposes of disclosure, and do not necessarily refer to the orientation of the present wafer once the wafer is embodied in a computing device.

DETAILED DESCRIPTION OF THE INVENTION

Referring initially to FIG. 1, a flash memory wafer is shown, generally designated 10. The flash memory wafer 10 can establish any flash memory chip for use in the computer arts. In one preferred embodiment, the flash memory wafer can be an electrically programmable memory (EPROM). As shown in FIG. 1, the wafer 10 can be incorporated into a computing device 12 for use by the computing device 12.

FIG. 1 shows that the wafer 10 includes a core memory array 14 and a periphery region 16 bounding at least a portion of the core memory array 14. As can be appreciated in reference to FIG. 1, the core memory array 14 includes a grid or matrix 18 of core memory cells 20, each of which must be isolated from its neighbors. Similarly, the periphery region 16 includes a grid or matrix 22 of peripheral memory cells 24, each of which must be isolated from its neighbors. In accordance with the present invention, components in the peripheral area can be isolated from each other using the above-mentioned LOCOS method. On the other hand, to facilitate improved fabrication and closer spacing of core memory cells 20 (and, hence, higher memory capacity of the wafer 10), the core memory cells 20 are isolated from each other using the novel groove wet etching process disclosed herein.

Figure 2:
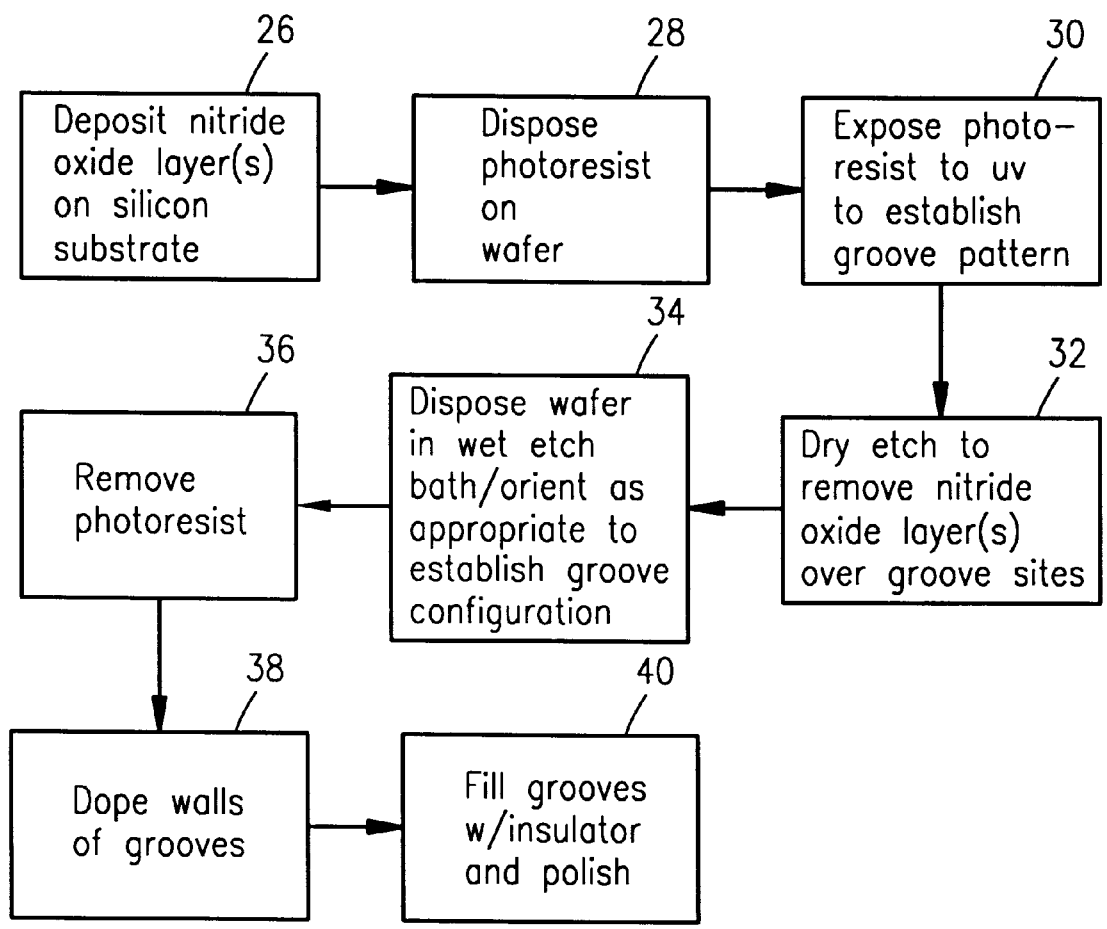
FIG. 2 is a flow chart of the present process for forming isolation grooves between memory elements of the memory core of the flash memory wafer.

FIG. 2 shows the novel groove wet etching process of the present invention. Commencing at block 26, nitride and oxide layers are deposited on a silicon substrate as appropriate for establishing either a non-self aligned memory or a self-aligned memory. Specifically, if the wafer 10 is to be a non-self aligned memory, a pad oxide layer is disposed on the silicon substrate, and a nitride layer is disposed on the pad oxide layer. In contrast, if the wafer 10 is to be a self aligned memory, a tunnel oxide layer is disposed on the silicon substrate, a polysilicon layer is disposed on the tunnel oxide layer, a high temperature oxide layer is disposed on the polysilicon layer, and a nitride layer is disposed on the high temperature oxide layer.

Moving to block 28, a suitable photoresist layer is disposed on the nitride layer. Then, at block 30 the photoresist layer is exposed to ultraviolet light to establish a predetermined pattern in the photoresist layer, with the predetermined pattern being the desired groove pattern of the wafer 10. Next, at block 32 a dry etching process is used to remove those portions of the oxide and nitride layers that are directly beneath the groove pattern made in the photoresist layer. This dry etch process can be a plasma etch process in accordance with dry etch procedures known in the art.

After dry etching, the process moves to block 34, wherein the wafer 10 is disposed in a wet etch solution for a time period and at an orientation that is appropriate to establish the grooves of the present invention in those portions of the silicon substrate that lie directly beneath the grid pattern that has been established through the photoresist and nitride and oxide layers. The wet etch solution is an appropriate solution such as potassium hydroxide (KOH) or other solvents disclosed in, e.g., U.S. Pat. No. 3,765,969, incorporated herein by reference. In accordance with the present invention and as discussed more fully below, the wet etch step at block 34 establishes isolation grooves. Each groove includes a wall that defines an angle of between twenty degrees and seventy degrees (20°–70°) relative to the respective vertical axis of the groove, to facilitate directing a dopant beam against the wall.

After the grooves have been formed, the wafer 10 is removed from the wet etch bath and, at block 36, the remaining portions of the photoresist layer are removed. Moving to block 38, the walls of the grooves are doped with N-type or P-type (preferably N-type) conductivity dopant by directing a dopant beam against the walls. Importantly, because of the slanted walls of the grooves, the source of the dopant beam need not be tilted and/or moved around the periphery of each groove. Instead, owing to the groove geometry described herein the dopant beam may be directed to simply propagate directly downward into the grooves to adequately dope the walls of the grooves. After doping, the grooves are filled with insulator material at block 40 and the insulator material is then polished down to the appropriate level using chemical-mechanical polishing procedures known in the art.

Figure 3:
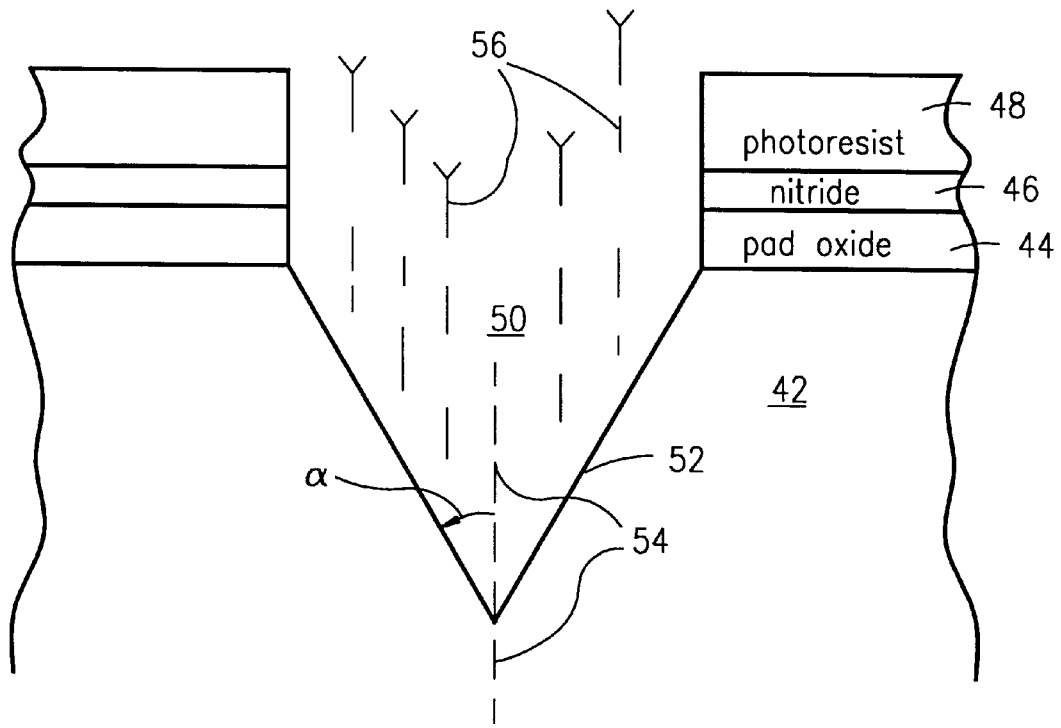
FIG. 3 is a schematic elevational view of a portion of the memory core after the wet etching process for non-self aligned cores, showing dopant beams in phantom.

FIG. 3 illustrates the above-described process for making a non-self aligned memory wafer. As mentioned above, such a wafer includes a silicon substrate 42, a pad oxide layer 44 on the substrate 42, and a nitride layer 46 on the pad oxide layer. Although FIG. 3 illustrates the doping process described in relation to block 38 above, a photoresist layer 48 is nonetheless shown in FIG. 3 for illustration purposes.

As shown in FIG. 3, the substrate 42 has been formed with a V-shaped groove 50 during the wet etching process described above. The groove 50 includes a V-shaped (in cross-section) wall 52 and defines a vertical axis 54. The wall 52 establishes an angle α of between twenty degrees and seventy degrees (20°–70°) with respect to the axis 54, and more preferably between forty degrees and sixty degrees (40°–60°) with respect to the axis 54. Most preferably, the angle a is between forty five degrees and fifty degrees (45°–50°).

With this structure, one or more dopant beams 56 can be directed from directly above the groove 50 (i.e., parallel to the vertical axis 54 of the groove 50) against the wall 52, to dope the wall 52 with dopant. In this way, the wall 52 can be doped with relatively little risk that the dopant beam might undesirably impinge on the layers 44, 46. Also, the wall 52 can be doped using a convenient orientation of the source of the dopant beams 56 vis-a-vis the groove 50, i.e., the source of the dopant beam can be stationed directly above the groove 50 and need not be moved around the periphery of the groove 50 during doping to cover the entire wall 52.

Figure 4:
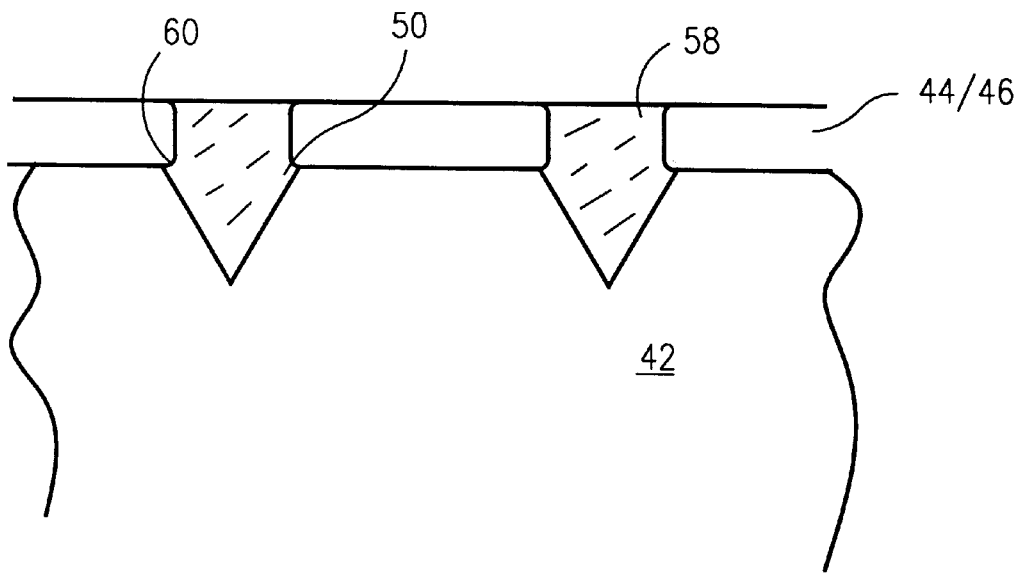
FIG. 4 is a schematic elevational view of the non-self aligned memory core after processing.

FIG. 4 shows that after doping, an insulator material 58 is disposed in the grooves 50 and polished down to the top surface of the layers 44/46. FIG. 4 further shows that polysilicon portions 60 of the layers 44/46 slightly overlap the grooves 50 such that the wafer shown in FIGS. 3 and 4 is a non-self aligned memory core wafer. After the above-disclosed steps of the present invention, fabrication is completed using conventional flash memory fabrication principles.

Now referring to FIGS. 5 and 6, the above-described process is illustrated in connection with a self aligned memory wafer. As mentioned above, such a wafer includes a silicon substrate 62, a tunnel oxide layer 64 on the substrate 62, a polysilicon layer 66 on the tunnel oxide layer 64, a high temperature oxide layer 68 on the polysilicon layer 66, and a nitride layer 70 on the high temperature oxide layer 68. For illustration purposes FIG. 5 also shows a photoresist layer 72 on the nitride layer 70. It is to be understood that the present etching can be undertaken in any desired silicon plane, e.g., the (111) plane or the (100) plane.

Figure 5:
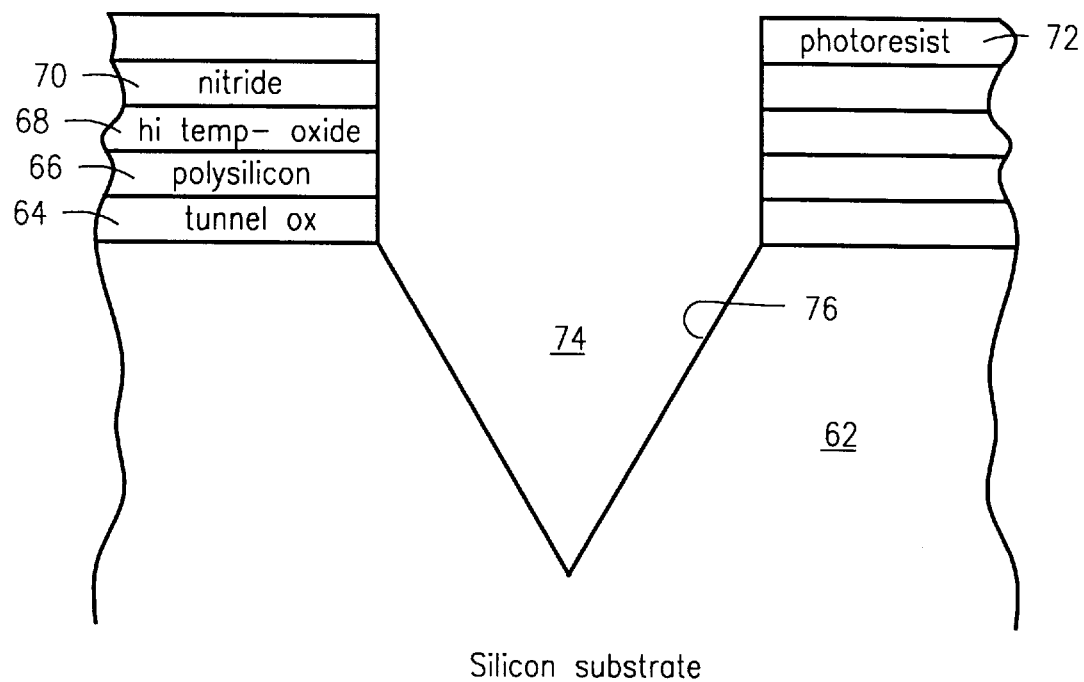
FIG. 5 is a schematic elevational view of a portion of the memory core after the wet etching process for self aligned cores.
Figure 6:
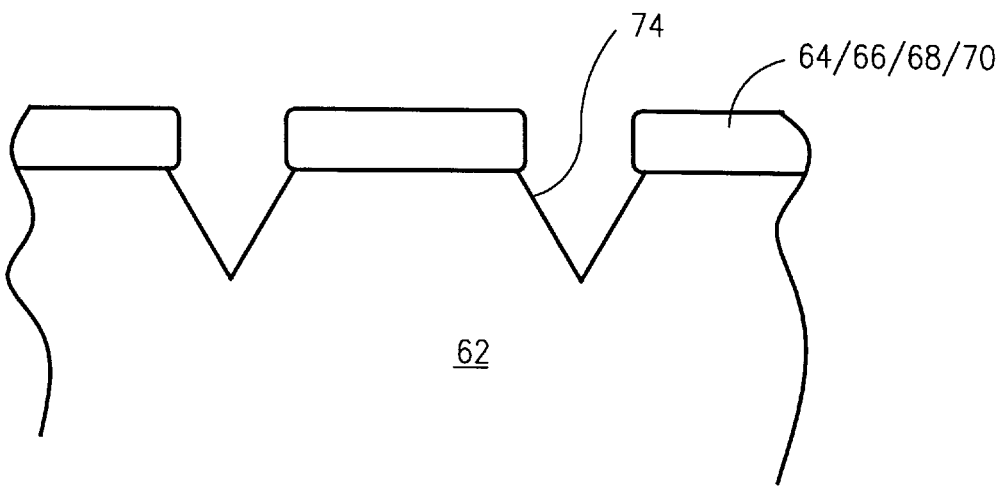
FIG. 6 is a schematic elevational view of the self aligned memory core after processing.

As can be seen in cross-reference to FIGS. 5 and 6, the substrate 62 has been formed with plural V-shaped grooves 74 having respective walls 76 during the wet etching process described above. Substantially no portions of the layers 64/66/68/70 overlap the grooves 74, such that the wafer shown in FIGS. 5 and 6 is a self aligned memory core wafer.

Figure 7:
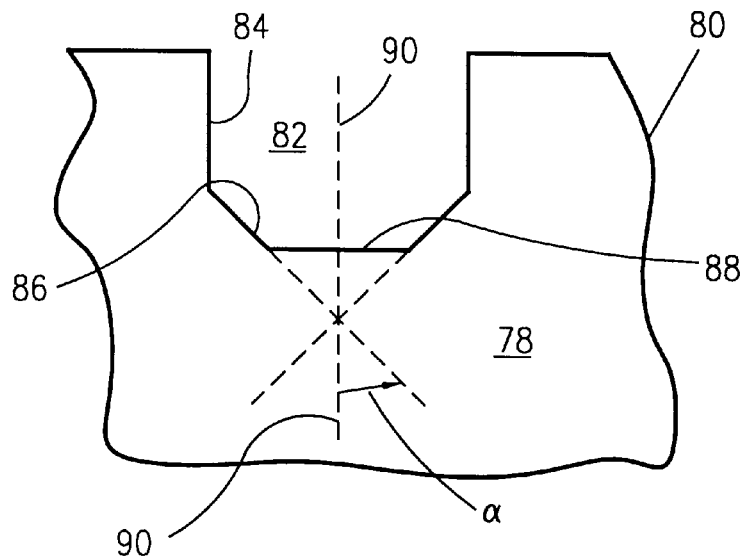
FIG. 7 is a schematic elevational view of an alternate groove formed by the wet etching process of the present invention.

FIG. 7 shows only the silicon substrate 78 of an alternate flash memory wafer, generally designated 80, having plural isolation grooves formed therein by the process above (only a single groove 82 shown in FIG. 7.) The groove 82 of the wafer 80 includes a vertical wall portion 84 terminating in a sloped wall portion 86. In turn, the sloped wall portion 86 extends toward and terminates in a horizontal groove floor 88. The above-described angle α is established between the sloped wall portion 86 and the vertical axis 90 of the groove 82. This facilitates doping that portion (i.e., the sloped portion 86) of the wall of the groove 82 that is closest to the bottom of the groove and, hence, that is furthest from the source of a dopant beam using a dopant beam that is parallel to the vertical axis 90.

Figure 8:
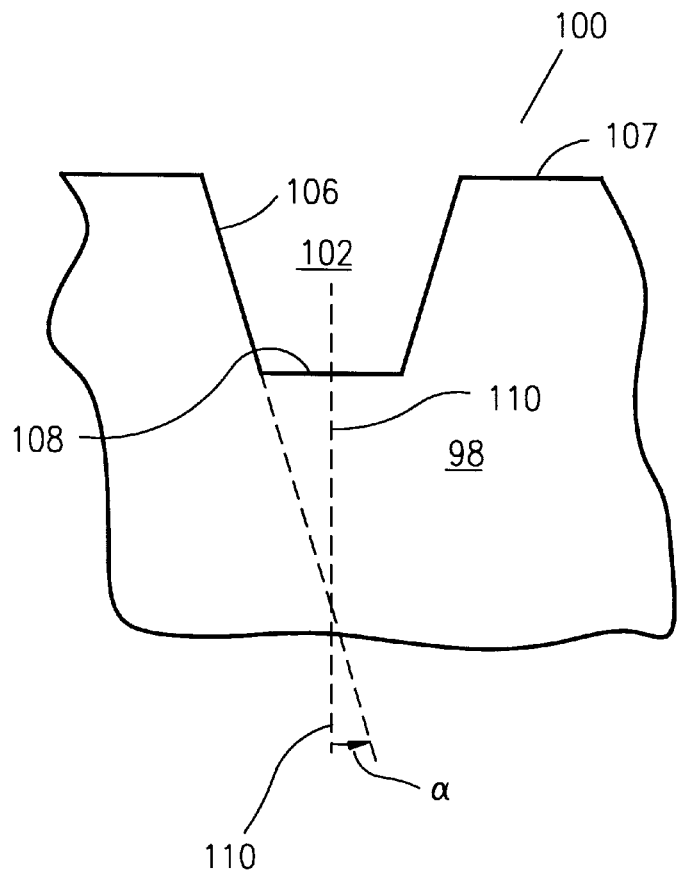
FIG. 8 is a schematic elevational view of yet another alternate groove formed by the wet etching process of the present invention.

FIG. 8 shows a silicon substrate 98 of an alternate flash memory wafer, generally designated 100, having plural isolation grooves formed therein by the process above (only a single groove 102 shown in FIG. 8.) The groove 102 of the wafer 100 includes a sloped wall portion 106 that starts at the top 107 of the silicon substrate 98 and extends toward and terminates in a horizontal groove floor 108. The above-described angle α is established between the sloped wall portion 106 and the vertical axis 110 of the groove 102. This facilitates doping that portion (i.e., the sloped portion 106) of the wall of the groove 102 that is closest to the bottom of the groove and, hence, that is furthest from the source of a dopant beam using a dopant beam that is parallel to the vertical axis 110.

The present invention has been particularly shown and described with respect to certain preferred embodiments and features thereof. However, it should be readily apparent to those of ordinary skill in the art that various changes and modifications in form and detail may be made without departing from the spirit and scope of the inventions as set forth in the appended claims, in which reference to an element in the singular is not intended to mean "one and only one" unless explicitly so stated, but rather "one or more". The inventions illustratively disclosed herein may be practiced without any element which is not specifically disclosed herein.

What is claimed is:

1. A flash memory wafer comprising: a periphery region, the periphery region defining peripheral memory elements said peripheral memory elements being isolated from each other by an insulator region, said insulator region being formed using a LOCOS method;

a core memory region, the core memory region defining core memory elements;

isolation grooves separating the core memory elements from each other, at least some of the isolation grooves being V-shaped isolation grooves and being formed by a wet etching process such that said at least some of the V-shaped isolation grooves define respective axes and respective walls, and wherein at least a respective portion of each wall defines an angle of between twenty degrees and seventy degrees (20°–70°) relative to the respective axis to facilitate directing a dopant beam against the walls, and a conductivity dopant implanted by said dopant beam into said respective walls, Said conductivity dopant being implanted in a parallel direction to said respective axes.

2. The flash memory wafer of claim 1, wherein the angle is between forty degrees and sixty degrees (40°–60°) with respect to the axis.

3. The flash memory wafer of claim 1, wherein a remainder of said isolation grooves that are not V-shaped are U-shaped isolation grooves and are formed by a dry plasma etch process.

4. The flash memory wafer of claim 1, further comprising an insulator disposed in at least some of the grooves.

5. The flash memory wafer of claim 1, comprising a silicon substrate, a pad oxide layer on the substrate, a nitride layer on the pad oxide layer, the flash memory wafer being a non-self aligned memory wafer.

6. The flash memory wafer of claim 1, comprising a silicon substrate, a tunnel oxide layer on the substrate, a polysilicon layer on the tunnel oxide layer, a high temperature oxide layer on the polysilicon layer, and a nitride layer on the high temperature oxide layer, and the flash memory wafer being a self aligned memory wafer.

7. A computing device incorporating the flash memory wafer of claim 1.

8. A non-self aligned flash memory wafer comprising:

a silicon substrate;

a pad oxide layer on the substrate;

a nitride layer on the pad oxide layer;

a periphery region, the periphery region defining peripheral memory elements, said peripheral memory elements being isolated from each other by an insulator region, said insulator region being formed using a LOCOS method;

a core memory region, the core memory region defining core memory elements;

V-shaped isolation grooves separating the core memory elements from each other, said isolation grooves being formed by a wet etching process such that the grooves define respective axes and respective walls, and wherein a respective portion of each wall defines an angle of between twenty degrees and seventy degrees (20°–70°) relative to the respective groove axis to facilitate directing a dopant beam against the walls;

a conductivity dopant implanted by said dopant beam into said respective walls, said conductivity dopant being implanted in a parallel direction to said respective axes; and an insulator material disposed in the isolation grooves.

9. A computing device incorporating the flash memory wafer of claim 8.

10. A self-aligned flash memory wafer comprising:

a silicon substrate;

a first oxide layer on the substrate, said first oxide layer being a tunnel oxide layer;

a polysilicon layer on the tunnel oxide layer;

a second oxide layer on the polysilicon layer;

a nitride layer on the second oxide layer;

a periphery region, the periphery region defining peripheral memory elements, said peripheral memory elements being isolated from each other by an insulator region, said insulator region being formed using a LOCOS method;

a core memory region, the core memory region defining core memory elements; V-shaped isolation grooves separating the core memory elements from each other, said isolation grooves being formed by a wet etching process such that the grooves define respective axes and respective walls, and wherein a respective portion of each wall defines an angle of between twenty degrees and seventy degrees (20°–70°) relative to the respective groove axis to facilitate directing a dopant beam against the walls;

a conductivity dopant implanted by said dopant beam into said respective walls, said conductivity dopant being implanted in a parallel direction to said respective axes; and an insulator material disposed in the isolation grooves.

11. A computing device incorporating the flash memory wafer of claim 10.

* * * * *